July 3, 1962 M. C. STEELE 3,042,852

SEMICONDUCTOR CRYISTOR CIRCUIT

Filed March 29, 1957

INVENTOR.
MARTIN C. STEELE
BY J. C. Whittaker
ATTORNEY

United States Patent Office 3,042,852

Patented July 3, 1962

3,042,852
SEMICONDUCTOR CRYISTOR CIRCUIT

Martin Carl Steele, Princeton, N.J., assignor to Radio Corporation of America, a corporation of Delaware Filed Mar. 29, 1957, Ser. No. 649,482
2 Claims. (Cl. 323—94)

This invention relates to improved semiconductor devices, and more particularly to improved semiconductor amplifier devices operated at low temperatures under conditions of high mobility of electric charge carriers.

Semiconductors differ basically from metals in that at room temperature semiconductors have resistivities in the range from .01 to $10^9$ ohm-centimeters, whereas metals have resistivities considerably below the lower limit for semiconductors. Furthermore, at very low temperatures, in the vicinity of the boiling point of liquid helium, certain metals, alloys, and compounds exhibit the phenomenon known as superconductivity in which the electric resistance has a value of zero. Semiconductors differ uniquely in this respect from metals in failing to show superconductivity. Further, in considering the resistivity versus temperature characteristic of a semiconductor, it is found that at very low temperatures most semiconductors show a marked increase in resistivity compared with their value at room temperature. This is particularly true for extrinsic type semiconductors whose electrical properties depend upon the presence of impurity substances therein. In extrinsic semiconductors of the N-type, donor impurities contribute electrons, which serve as the current carriers; in P-type semiconductors, acceptors remove electrons, and "hole" current, i.e., positive carrier current, predominates.

It is known that at low temperatures the electric charge carriers present in various semiconductor bodies attain relatively high mobilities so that a relatively small electric field of the order of a few volts per centimeter can impart enough energy to the electric charge carriers, i.e., electrons or holes present in excess, to cause impact ionization of the donor or acceptor impurities. When this occurs, the semiconductor exhibits a marked breakdown in its resistivity characteristic; at this breakdown point, a relatively small change in the electric field thus produces a marked increase in the flow of current.

Accordingly, it is an object of the present invention to provide an improved semiconductor amplifier operating in the breakdown or high mobility region.

It is another object to provide an improved semiconductor device which may be used for purposes of amplification and signal mixing.

It is a further object to provide a plurality of such improved devices suitable as computer elements.

It is still a further object to provide an improved relaxation oscillator using such improved devices.

The foregoing objects are accomplished in accordance with the invention wherein it is proposed to use a magnetic field to modulate or control this electrical breakdown phenomenon so as to provide improved amplifier devices. Thus if a magnetic field is applied either transversely or longitudinally to the direction of current flow in the semiconductor body at a given electric field, the current flow is found to decrease. Hence, by providing biasing electric and magnetic fields of suitable magnitude at a selected low temperature to insure impact ionization occurring, a relatively small change in the magnitude of the magnetic field results in a considerable increase in current. Such a magnetic field may be the vector sum of a biasing magnetic field in one direction and a colinear control magnetic field in the opposite direction. Semiconductor amplifier devices of this type may be referred to as "cryistors" by analogy with other semiconductor variable resistors such as thermistors and transistors.

An important feature of this invention is that a semiconductor body having a given resistivity versus temperature characteristic is operated in an appropriate temperature region at relatively low values of electric field close to its resistivity breakdown point, the current through the device being modulated by a control magnetic field so that the semiconductive material may be driven from a high resistivity to a low resistivity condition or vice versa. As a further feature, a biasing magnetic field is provided so that a relatively small change in the magnitude of the control field results in a substantial change in the flow of current through the cryistor device.

The invention will be described in greater detail by reference to the following description taken in conjunction with the appended drawing in which.

Similar reference characters are applied to similar elements throughout the drawing.

Figure 1:
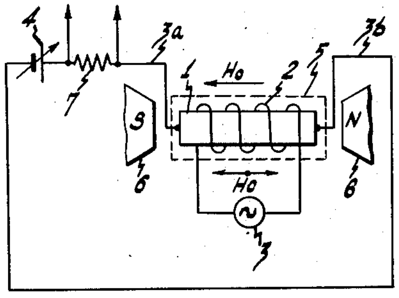
FIG. 1 is an elevational view of a cryistor according to the instant invention including a schematic representation of a circuit in which this device may be used.

Referring to FIG. 1, a body 1 of semiconductive material is shown in a typical circuit arrangement as a cryistor amplifier. For the purposes of this invention, the semiconductive material used should preferably have a relatively steep resistivity versus temperature characteristic and show an impact ionization breakdown region at a given low temperature. Crystalline semiconductive materials such as N or P-type germanium, silicon, alloys of germanium and silicon, and P-type indium antimonide are particularly preferred. Means for establishing a control magnetic field about the body 1 is shown in the form of a coil 2 of fine wire closely wrapped about the semiconductor body 1. A signal source 3 may be used to establish the control magnetic field and vary it in any desired manner. Electrical connection is made to the semiconductor body 1 by means of leads 3_a_ and 3_b_. These leads are connected to the body by any of several well-known techniques in this field, such as soldering to vapor-deposited metal coatings on the semiconductor body. Or the metallic coatings may be formed from a cured silver paste or by vacuum evaporation or the like. Electrical biasing means 4 such as a variable source of voltage is used for establishing the electric field of the semiconductor body close to the breakdown region. A low temperature thermostat 5, such as a liquid-helium cryostat, is shown schematically in dotted outline surrounding the semiconductor body 1 and the control magnet coil 2. The cryostat is used for maintaining the desired low temperature. The attainment of the desired low temperatures may be readily accomplished, as described, for example, in the article entitled "Low Temperature Electronics," which appeared in Proceedings of the IRE, vol. 42, pp. 408–413, February, 1954. Liquid-helium liquefiers are commercially available, as well as double Dewar flasks which use liquid nitrogen in the outer Dewar and lose less than one per cent of their liquid helium per day. Where a material such as germanium is used as the semiconductor, an upper temperature limit of 25 to 32° Kelvin (K.) is feasible, although a lower temperature is preferably employed where it is desired to have the magnet coil wire 2 operate in a superconductive state. For a semiconductive material such as silicon, an upper temperature limit approximately that of liquid nitrogen, such as 80° K., may be used. However, liquid hydrogen or liquid helium temperatures are generally preferred.

In order to maximize the effect of the control magnetic field, it is preferred to maintain a biasing magnetic field about the semiconductor body 1 in a direction substantially colinear with the control magnetic field. A permanent magnet 6 may be used to provide such a biasing magnetic field. Thus in FIG. 1 the direction of the biasing magnetic field $H_0$ is shown as directed from right to left. The control magnetic field, $H_c$, assuming direct-current energizing of coil 2, has a significant portion of its field colinear with the biasing magnetic field and preferably in a direction opposed thereto. Where source 3 is an alternating source of voltage, as shown in FIG. 1, the control magnetic field will alternately oppose and reinforce the biasing magnetic field. As will be subsequently explained, by using a biasing magnetic field, only a relatively small control magnetic field, produced by operation of signal source 3 and energizing of coil 2, is required in order to drive the semiconductor body 1 into a breakdown condition. An amplified replica of the input signal 3 fed to the control magnet coil 2 is then obtained across output impedance element 7.

Figure 2:
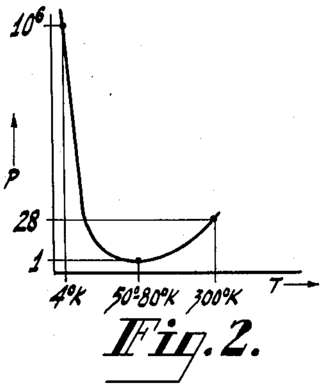
FIG. 2 is a graphical representation of the variation of resistivity with temperature for a semiconductor material such as germanium.
Figures 3, 4:
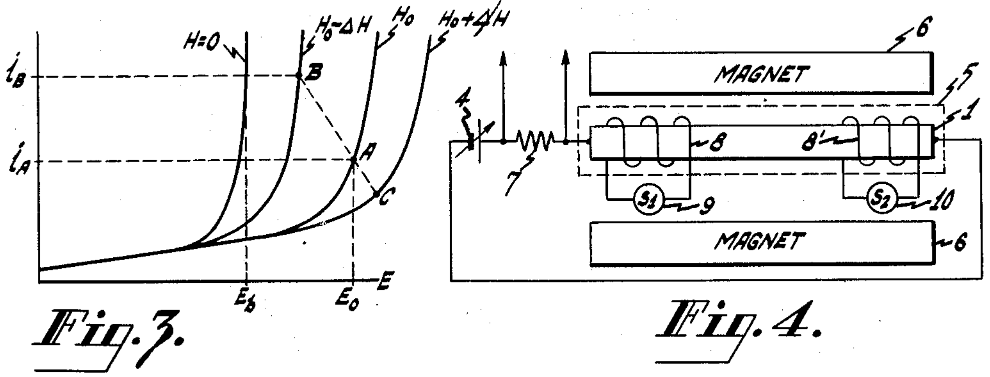
FIG. 3 is a graphical representation of the variation in current with electric field for different conditions of resultant magnetic fields.
FIG. 4 is an elevational view partly in section of a semiconductor device according to the instant invention in which two control magnetic fields are used, and including a schematic representation of associated circuitry.

The mode of operation of the cryistor may be more fully understood with reference to the graphs shown in FIGS. 2 and 3. In FIG. 2 is illustrated a resistivity versus temperature curve for semiconductive germanium, which is generally preferred for the devices of this invention. The logarithm of the resistivity, $\rho$, is plotted as the ordinate, and the absolute temperature, in degrees Kelvin, is plotted as the abscissa. At room temperature, for a typical example, the germanium has a resistivity of approximately 28 ohm-centimeters, the resistivity reaching a minimum at a temperature between 50 and 80° K. and then rising rapidly to approximately $10^6$ ohm-centimeters at about 4° K., the temperature obtained with liquid helium. It should be noted that at very low temperatures only a relatively small increment in temperature is required in order to rapidly lower the resistivity by several decades.

It has been found that at very low temperatures, semiconductors such as germanium, germanium-silicon alloys, and indium antimonide exhibit an electrical breakdown phenomenon at low values of electric field, of an order of about 10 volts per centimeter. The electric carriers in the semiconductor can attain such high mobilities that only a relatively small electric field is required to impart enough energy to the electrons or holes to cause impact ionization of the donors or acceptors. When this occurs, the semiconductor exhibits a breakdown characteristic such as that shown in FIG. 3 by the curve labeled H=O. This curve represents a plot of current versus voltage in the absence of a magnetic field for a semiconductor body maintained at low temperature under conditions of high mobility. Thus at the breakdown voltage $E_b$, a germanium semiconductor having a room-temperature resistivity of 28 ohm-cm. can, at 4° K., undergo a change in resistivity from $10^6$ ohm-cm. to 40 ohm-cm. As shown, this large change in resistivity can be brought about by a relatively small change in voltage in the vicinity of $E_b$. If a magnetic field is applied in a transverse or longitudinal direction with respect to current flowing in the semiconductor, the breakdown voltage, $E_b$, required has been found to increase. Thus by properly biasing the semiconductor with respect to a given value of voltage, changing the intensity of the magnetic field is sufficient to cause breakdown in resistivity to occur.

In operation of a cryistor device according to this invention, the voltage is adjusted to a given value so that in the presence of a biasing magnetic field $H_0$ the semiconductor is operating in a desired partial or prebreakdown mode. This is shown in FIG. 3 by the curve labeled $H_0$. Because of the magnetic field versus breakdown characteristics, it is preferred to use a biasing magnetic field, substantially colinear with the control magnetic field, rather than operating in an on-off state with respect to magnetic field. Thereby, for the value of $E_0$ used, a relatively small change in magnetic field will suffice to drive the semiconductor further into the breakdown mode. Thus, in FIG. 1, upon applying an input signal 3 to coil 2, such as a direct-current signal, for example, the current through the coil will set up a counter field $\Delta H$ to the biasing field, with the resulting field equal to $H_0-\Delta H$. This curve is shown in FIG. 3 labeled $H_0-\Delta H$. With $E_0$ only slightly changed in value, the operating point of the semiconductor shifts from point A to point B. Thus at point A, in the absence of the control magnetic field, the resistivity is relatively high and little current flows. In the presence of the opposed colinear control magnetic field, namely at point B, the resistivity becomes relatively low and there is a considerable increase in the flow of current through the semiconductor body. If input signal 3 is an alternating current source, the control magnetic field will alternately oppose and reinforce the biasing magnetic field. The net reinforced field is shown in FIG. 3 by the curve labeled $H_0+\Delta H$. Thus for an alternating control field the operating point of the semiconductor will alternately be displaced from point A to points B and C.

It is generally preferred for most types of operation, although not an essential requirement therefor, that the resistance of the semiconductor body 1 be such in relation to other circuit elements, such as resistor 7, that it alone determines substantially all of the current flowing through the circuit. This applies whether the semiconductor body 1 is in the partial or prebreakdown mode, as at point A, or operating at breakdown, as at point B. Thereby the applied voltage is substantially all applied across the semiconductor body, thus serving to stabilize the value of $E_0$.

By expending just enough power to keep current flowing in coil 2 to set up a control magnetic field, the power being dissipated in the semiconductor can be changed by a factor of about $10^5$. It is not essential, although considered highly desirable, that the coil be operated at a temperature at which it is superconducting. Thus if the semiconductor body is being operated at a liquid-helium temperature, it is preferable to operate the coil at this temperature also, and to construct it from a wire that is superconducting at this temperature, such as niobium or lead. In this manner, power dissipation losses for the coil would be nil for direct-current operation.

In the device illustrated in FIG. 4 the semiconductor body 1 is shown disposed in a cryostat 5 with two coils 8 and 8' disposed thereabout. These coils are each selectively energizable by signal sources 9 and 10. A biasing magnetic field is established by permanent magnet 6. In operation of this device, a biasing electric field close to the point of breakdown is established by adjustment of variable voltage means 4, and coils 8 and 8' are energized by input signal sources 9 and 10. The output is derived across impedance 7. As mentioned, the value of impedance 7 is substantially less than that of the impedance of the semiconductor body in its breakdown state. Hence, it is the resistance of the semiconductor body that essentially determines the current flow through the circuit. By operation of this device in a desired manner, it will be seen that the output signal obtained may be a mixed, modulated or demodulated signal depending upon the relationship of the input signal sources.

Figures 5, 6, 7, 8:
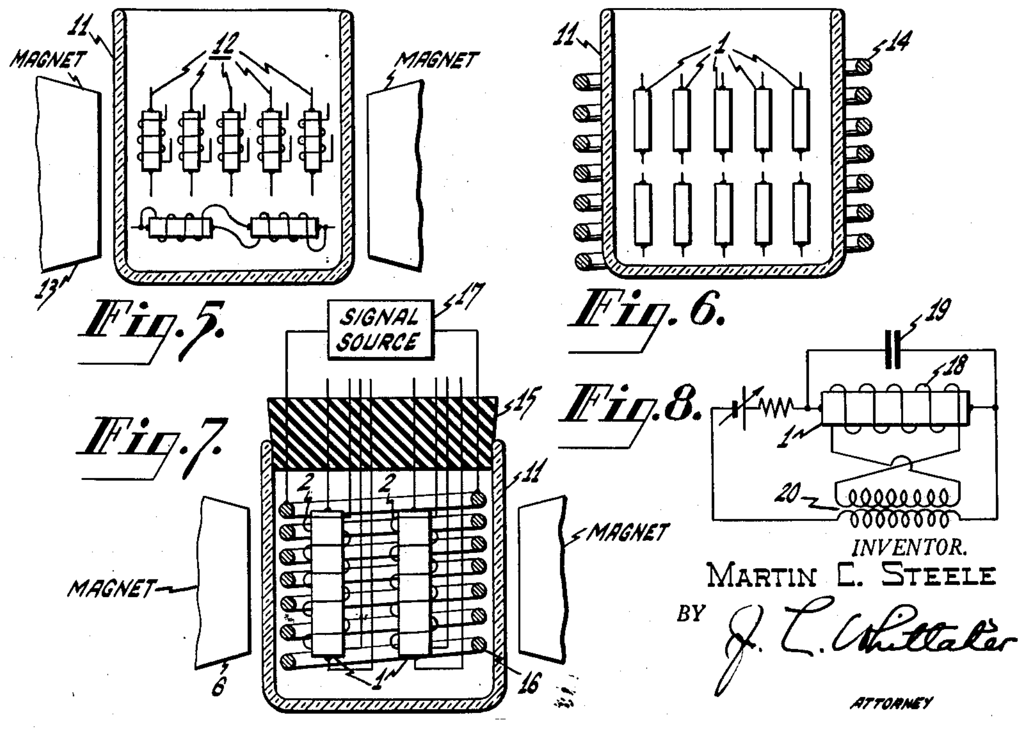
FIG. 5 is an elevational view partly in section of a plurality of cryistors maintained in a common biasing magnetic field.
FIG. 6 is an elevational view partly in section of a plurality of semiconductor bodies influenced by a common control magnetic field.
FIG. 7 is an elevational view partly in section of a plurality of cryistors in which the biasing magnetic field used is variably controlled.
FIG. 8 is a schematic representation of the use of this device as a relaxation oscillator.

Although the biasing magnetic fields have been shown in FIGS. 1 and 4 as distinct fields associated with each semiconductor body, a single biasing magnetic field may be used in which a plurality of the cryistor devices are immersed. This is illustrated in FIG. 5 wherein is shown a Dewar flask 11 used for maintaining the desired low temperature in which the cryistors 12 are placed. As may be noted, each of these cryistor devices is essentially a four terminal element consisting of two connections to the semiconductor body for the flow of current therethrough and two connections to the coil for establishing the control magnetic fields. The biasing magnetic field may be established by a permanent magnet 13, as illustrated, or by a solenoid, as desired, in a direction such that a substantial portion of its field is colinear with that established by the individual coils. Although the magnet 13 has been shown as outside of the Dewar flask, it may equally well be immersed therein. In the lower half of the flask is shown two cryistors connected in flip-flop circuit arrangement. Such devices may form part of a computer circuit, and many such devices may be conveniently arranged in typical computer circuitry in a very small volume.

In FIG. 6 is illustrated an embodiment of this invention in which a single control magnetic field is simultaneously applied to a plurality of semiconductor bodies 1. These bodies are contained in a Dewar flask 11 which serves as a cryostat therefor, maintaining the desired low temperature. Inasmuch as a common control magnetic field is applied, there are no individual control coils wound about the semiconductor bodies and therefore only two leads are associated with each semiconductor body. These bodies are operated in the manner herein before described, namely, at the semiconductor breakdown point. The control magnetic field is shown as provided by a solenoid 14, although any similar arrangement providing a selectively variable control magnetic field may equally well be used. If the solenoid providing the control field is located outside of the cryostat, as shown, the windings thereof may be of copper or other suitable conductor. Where the solenoid providing the control field is located within the cryostat, a material that is superconducting at the temperature employed is preferred inasmuch as no power will then be required to sustain the magnetic field. Although not shown, a biasing colinear magnetic field is preferably present. The devices illustrated are particularly suitable where it is desired to have a plurality of switching operations occurring simultaneously. Thus many of the semiconductor bodies may very conveniently be located within a small volume, these bodies being driven into a breakdown state simultaneously by application of a single control magnetic field.

In FIG. 7 is illustrated an embodiment of this invention particularly suitable for multiple mixing and modulation operations. The semiconductor bodies 1 are shown with individual control magnetic fields obtained by coils 2 wound thereabout. It is preferred that the coils 2 be made of a conductive material that is superconducting at the temperatures employed. The semiconductor devices are immersed in a cryostat such as a Dewar flask 11 containing a suitable low-temperature environment. The leads from the semiconductor body and from the control coils are passed through seal 15 and connected to desired circuitry, not shown. In this embodiment of the invention, the substantially colinear biasing magnetic field is shown as provided by two sources, one giving a fixed biasing magnetic field, such as magnet 6, the other giving a variable one, such as solenoid 16. Signal source 17 is used to control the operation of this variable magnetic field. By pulsing of this magnetic field either synchronously or in opposition to the control magnetic field, or in some other desired manner, each in response to a given signal source, various output signals may be obtained of a mixed or modulated nature.

The cryistor of this invention also finds usefulness as a relaxation oscillator, as illustrated in FIG. 8. As shown therein, as oscillatory circuit consisting of an inductor 18 and a capacitor 19 is used to sustain oscillation in the semiconductor body 1 driving it alternately from a breakdown to an ohmic condition. Transformer arrangement 20 is used to invert the direction of the magnetic field in order to provide an opposing field which will sustain oscillation rather than become degenerate. It will be readily apparent that oscillation may also be sustained by providing a properly oriented colinear biasing magnetic field in suitable opposition to the control magnetic field.

For purposes of illustration, as an example of a typical operation of the circuit illustrated in FIG. 1, one may assume a square wave of equal on and off periods of frequency $f$ as the input signal source 3 to the device shown. Voltage biasing means 4 may be adjusted to provide a voltage of 10 volts. Impedance 7 has a value of $10^6$ ohms, and the semiconductor body may have a resistance of 400 ohms at breakdown. This breakdown value corresponds to an N-type germanium crystal having dimensions of $0.1\times0.1\times1$ cm. For an inductance $L=4\mu H$, corresponding to a single layer coil of 40 turns of 5-mil diameter wire over a length of 1 cm. and a $\Delta H$ value of 20 gauss, a power gain of 50 is obtained, for the given power output of 2.5 milliwatts. Inasmuch as no semiconductor body becomes superconducting no matter how low a temperature is used, even at the breakdown state of the semiconductor a resistance of 400 ohms may be conveniently obtained. Thus a cryistor device is particularly convenient in matching the impedance of other circuit elements and in computing time constants.

As mentioned, the phenomenon of superconductivity is not responsible for the operation of this device, but rather that of impact ionization due to the high mobility of charge carriers in semiconductors at very low temperatures. However, although not essential in the operation of this device, the phenomenon of superconductivity may preferably be utilized with respect to the magnet coil in order to have the control magnetic field in a state of no power dissipation. Thus materials such as niobium and lead, which are superconducting at liquid helium temperatures, may be used for the control windings of the coil. Where the materials providing the control magnetic field are located outside the low temperature region, any conventional conductive material such as copper or the like may be used. Because semiconductor bodies may be made in extremely small sizes, as is well known in this art, cryistor devices are particularly useful in computer circuitry where many such devices may be included within a relatively limited volume.

While I have described several embodiments illustrating the principles of this invention, it will be apparent that the cryistor device herein described may be used in many related applications suggested by consideration of the principles of this invention. For example, the devices may be used as magnetometers in magnetic memory storage circuits to determine the magnetic state of a magnetic material without disturbing it. They may be used as current, voltage, and power amplifiers. They may also be used as a means of reading magnetic tape recordings; thus running the tape in front of the semiconductor body will change the magnetic field seen by it, the resulting current in the semiconductor body following the changes in the magnetic field. Also, these devices are useful for video or audio switching as well as for various types of time multiplexing and signal sampling devices. Thus while I have described above the principles of my invention in connection with specific devices and applications, it is to be clearly understood that this description is made only by way of example and not as a limitation to the scope of my invention as set forth in the objects thereof and in the accompanying claims.

What is claimed is:

1. In combination, a body of semiconductive material having a resistivity which varies inversely with temperature in a given temperature range but which sharply decreases due to impact ionization when an electric field of greater than a given value is applied to the body and the body is at a temperature which is lower than a given value within said range; conductive means connected to said body for applying a voltage thereto and thereby establishing an electric field through the body; and a coil formed of a material which is superconductive at the temperature at which the resistivity of the body sharply decreases, wound around said body, whereby when said body is maintained at a temperature and in an electric field such that its resistivity has sharply decreased, small variations in the magnetic field applied by said coil produce substantially larger variations in said resistivity.

2. In the combination as set forth in claim 1, further including means for immersing the body in a magnetic field of constant value.

References Cited in the file of this patent

UNITED STATES PATENTS

| | | |
|---|---|---|
| 2,649,569 | Pearson | Aug. 18, 1953 |
| 2,666,884 | Ericsson et al. | Jan. 19, 1954 |
| 2,725,474 | Ericsson et al. | Nov. 29, 1955 |
| 2,736,858 | Welker | Feb. 28, 1956 |
| 2,832,897 | Buck | Apr. 29, 1958 |
| 2,891,160 | Lebland | June 16, 1959 |

OTHER REFERENCES

Hewlett: "Superconductivity," General Electric Review, June 1946, pages 19–25.

The Cryotran, A Superconductive Computer Component, Buck, pages 482–93 of Pire for April 1956, 250–36–24.

Scalar et al.: Physics and Chemistry of Solids, volume 2, 1957, pages 1–23.